(12) United States Patent
Yonezawa et al.

(10) Patent No.: US 9,887,635 B2
(45) Date of Patent: Feb. 6, 2018

(54) DOUBLE-ENDED FORWARD CONVERTER AND POWER SUPPLY DEVICE

(71) Applicant: FUJITSU LIMITED, Kawasaki-shi, Kanagawa (JP)

(72) Inventors: Yu Yonezawa, Sagamihara (JP); Yoshiyasu Nakashima, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 14/845,139

(22) Filed: Sep. 3, 2015

(65) Prior Publication Data

US 2015/0381065 A1    Dec. 31, 2015

Related U.S. Application Data

(63) Continuation of application No. PCT/JP2013/001975, filed on Mar. 22, 2013.

(51) Int. Cl.
*H02M 3/335*    (2006.01)
*H02M 3/337*    (2006.01)
(Continued)

(52) U.S. Cl.
CPC ....... *H02M 3/3376* (2013.01); *H02M 3/3378* (2013.01); *H02M 1/08* (2013.01);
(Continued)

(58) Field of Classification Search
CPC .......... H02M 3/33569; H02M 3/3388; H02M 3/3372; H02M 3/3378; H02M 3/337; H02M 3/33576; H02M 3/3382; H02M 3/3385; H02M 3/338; H02M 3/3384; H02M 3/33561; H02M 3/3387; H02M 3/3374; H02M 3/3376
(Continued)

(56) References Cited

U.S. PATENT DOCUMENTS 8,742,691 B2 * 6/2014 Imanaka ............ H05B 41/2828
                                                    315/209 R
2005/0030777 A1   2/2005 Dogome et al.
(Continued)

FOREIGN PATENT DOCUMENTS

JP    64-012867 A    1/1989
JP    09-140163 A    5/1997
(Continued)

OTHER PUBLICATIONS

Jun. 18, 2013 International Search Report issued in International Patent Application No. PCT/JP2013/001975.

*Primary Examiner* — Nguyen Tran
(74) *Attorney, Agent, or Firm* — Arent Fox LLP

(57) ABSTRACT

A double-ended forward converter includes: a first switching element and a second switching element that are coupled to a primary side of a transformer; a pulse generation circuit that generates a pulse signal for controlling the first and second switching elements; an isolation transformer that converts the pulse signal into an alternating-current signal; a rectifier circuit that rectifies the alternating-current signal and generate gate voltages of the first and second switching elements; a driver circuit that includes a third switching element which drives gates of the first and second switching elements, a voltage generated on a secondary side of the isolation transformer being input to a gate of the third switching element; and a minus bias generation circuit that generates a source voltage of the third switching, based on a change in the voltage generated on the secondary side of the isolation transformer.

2 Claims, 8 Drawing Sheets

(51) Int. Cl.
  *H02M 1/08* (2006.01)
  *H03K 17/61* (2006.01)
  *H03K 17/691* (2006.01)

(52) U.S. Cl.
  CPC .......... *H02M 3/3353* (2013.01); *H03K 17/61* (2013.01); *H03K 17/691* (2013.01); *Y02B 70/1483* (2013.01)

(58) Field of Classification Search
  USPC .............................................. 363/16, 22–26
  See application file for complete search history.

(56) References Cited

U.S. PATENT DOCUMENTS

| | | | | |
|---|---|---|---|---|
| 2007/0109817 | A1* | 5/2007 | Shimura | H02M 1/08 363/16 |
| 2007/0253226 | A1 | 11/2007 | Fukumoto | |
| 2012/0306469 | A1 | 12/2012 | Shono | |
| 2012/0307527 | A1* | 12/2012 | Schwander | H02M 3/33569 363/16 |
| 2013/0016531 | A1* | 1/2013 | Aso | H02M 1/4225 363/16 |
| 2013/0069551 | A1* | 3/2013 | Kitamura | H02M 3/3372 315/205 |

FOREIGN PATENT DOCUMENTS

| | | |
|---|---|---|
| JP | 2004-048965 A | 2/2004 |
| JP | 2005-065393 A | 3/2005 |
| JP | 2007-288822 A | 11/2007 |
| JP | 2012-249492 A | 12/2012 |

* cited by examiner

FIG. 5A $V_{in}$
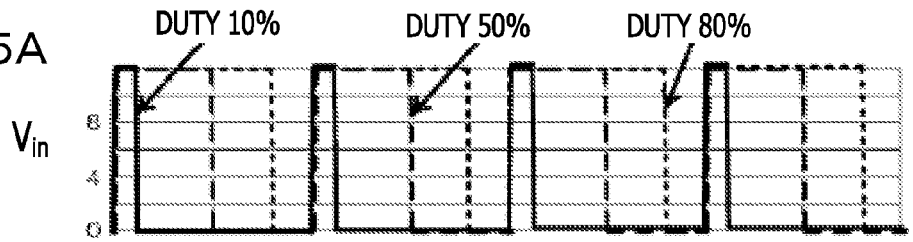
FIG. 5B $V_{Trans}$
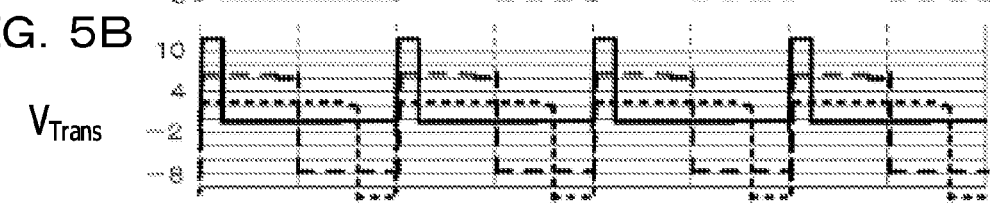
FIG. 5C $V+$
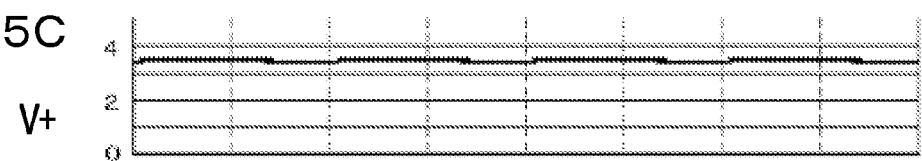
FIG. 5D $V-$
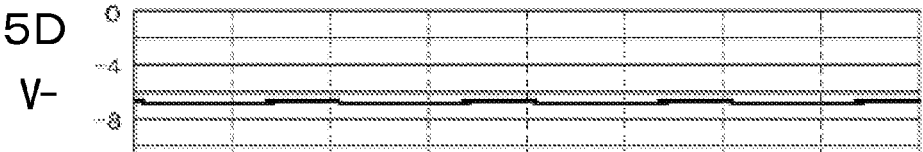
FIG. 5E $V_G$
FIG. 5F $V_S$
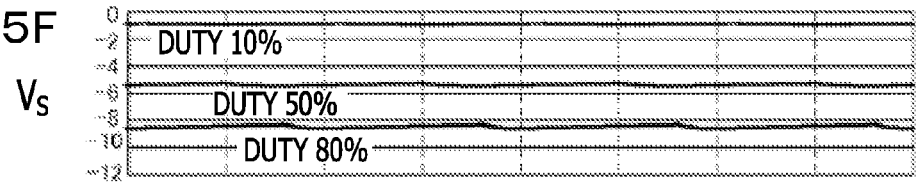
FIG. 5G $V_{OUT}$
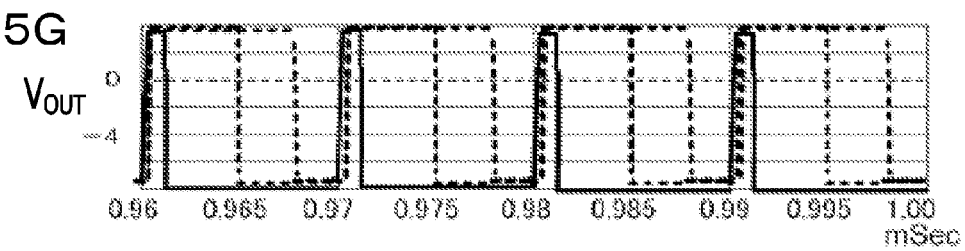

DOUBLE-ENDED FORWARD CONVERTER AND POWER SUPPLY DEVICE

CROSS-REFERENCE TO RELATED APPLICATION

This application is a continuation application of International Application PCT/JP2013/001975 filed on Mar. 22, 2013 and designated the U.S., the entire contents of which are incorporated herein by reference.

FIELD

The embodiments discussed herein are related to a double-ended forward converter including a normally-on switching element.

BACKGROUND

In recent years, saving of energy resources in various fields has attracted attention, and the influence thereof has spread to the field of, for example, power supply. Specifically, the higher efficiency of, for example, a switching power supply has been desired.

The switching power supply converts an input direct-current voltage to a desired direct-current voltage by using a direct current (DC)-DC converter and outputs the desired direct-current voltage as a stabilized power supply voltage.

The following is a reference document.
[Document 1] Japanese Laid-open Patent Publication No. 2005-65393.

SUMMARY

According to an aspect of the invention, a double-ended forward converter includes: a first switching element and a second switching element that are coupled to a primary side of a transformer; a pulse generation circuit that generates a pulse signal for controlling the first and second switching elements; an isolation transformer that converts the pulse signal into an alternating-current signal; a rectifier circuit that rectifies the alternating-current signal and generate gate voltages of the first and second switching elements; a driver circuit that includes a third switching element which drives gates of the first and second switching elements, a voltage generated on a secondary side of the isolation transformer being input to a gate of the third switching element; and a minus bias generation circuit that generates a source voltage of the third switching, based on a change in the voltage generated on the secondary side of the isolation transformer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 5A to 5G are simulation waveform diagrams of the gate drive circuit of an embodiment;

DESCRIPTION OF EMBODIMENTS

Figure 1:
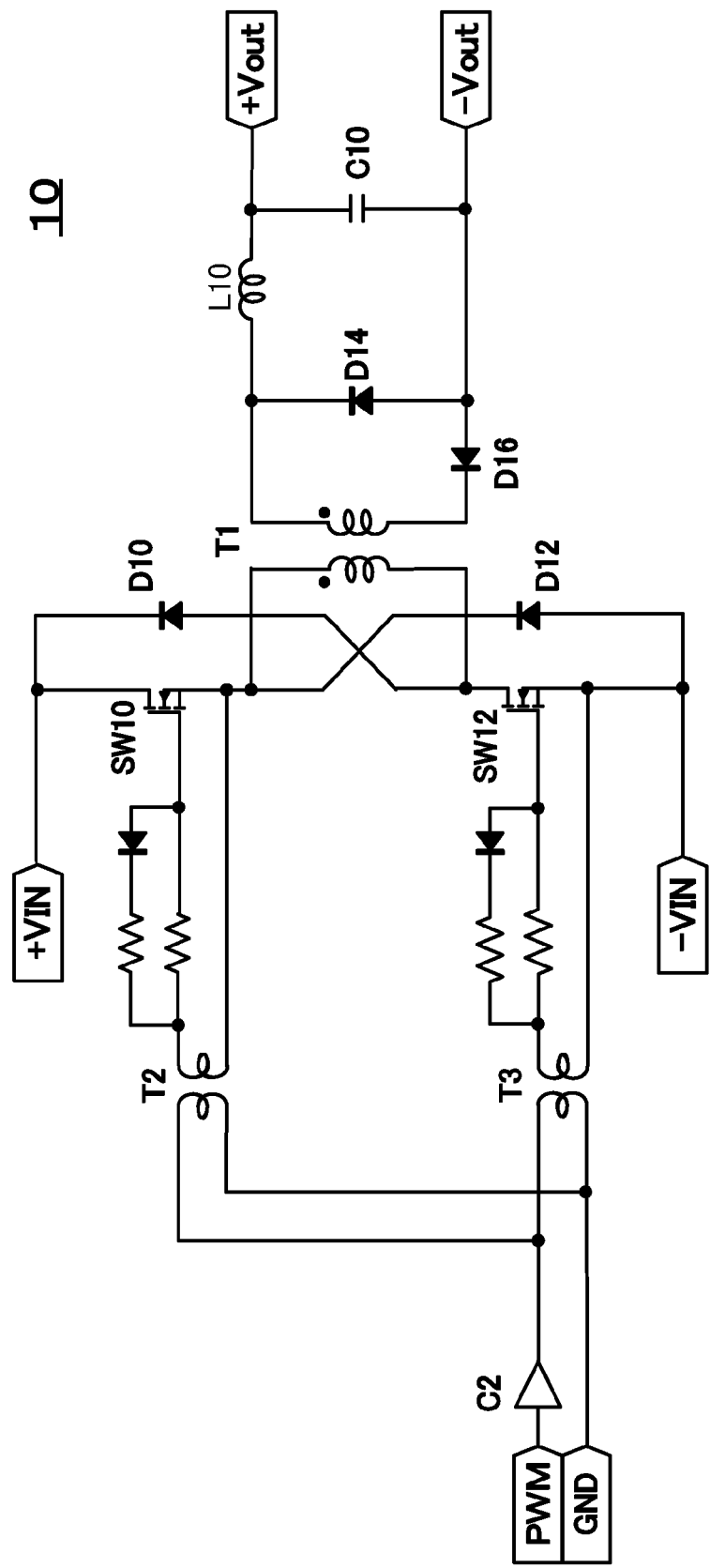
FIG. 1 is a circuit diagram of a general double-ended forward converter.

FIG. 1 illustrates a circuit diagram of a general double-ended forward (bipolar) converter serving as a type of DC-DC converter.

A double-ended forward converter 10 illustrated in FIG. 1 steps down an input direct-current voltage VIN, thereby generating an output direct-current voltage Vout of a desired electric potential.

The input direct-current voltage VIN is a direct-current voltage of 385 V obtained by converting an AC voltage of 80 (V) to 265 (V) to a direct-current voltage by using a switching power supply in, for example, a server or the like. In addition, furthermore, in order to be used within the server, the input direct-current voltage VIN is stepped down to a predetermined voltage by the double-ended forward converter 10. For safety, based on a standard such as IEC60950, an AC input is supposed to be isolated from a direct-current voltage used within the device. Therefore, both the primary-side VIN generated from the AC input and the secondary-side Vout use the double-ended forward converter 10 based on a method of being isolated using a transformer T1.

The double-ended forward converter 10 includes primary-side switches SW10 and SW12, feedback diodes D10 and D12, the transformer T1, an inductor L10, a smoothing capacitor C10, and synchronous rectifiers D14 and D16.

For example, metal oxide semiconductor field-effect transistors (MOSFETs) are used for the primary-side switches SW10 and SW12. In the double-ended forward converter 10, if the primary-side switches SW10 and SW12 are simultaneously subjected to switching and caused to perform on-off actions, thereby applying a current to the primary side of the transformer T1, alternating-current power is generated on the secondary side of the transformer T1. The alternating-current power is rectified by the first and second rectifiers D14 and D16 and is smoothed by the choke coil L10 and the output smoothing capacitor C10, thereby being converted to the output direct-current voltage Vout. Note that synchronous rectification in which the first and second rectifiers D14 and D16 are replaced with low-resistance FETs in order to reduce a loss is used in some cases.

Since the transformer T1 is excited in only one of two directions, a coil of the transformer T1 stores energy as soon as the primary-side switches SW10 and SW12 are turned off. Therefore, energy is fed back by the feedback diodes D10 and D12, thereby resetting magnetic fluxes.

The on-off actions of the primary-side switches SW10 and SW12 are controlled by a pulse width modulation (PWM) signal. A circuit that generates the PWM signal uses the output direct-current voltage Vout serving as a power supply on the secondary side of the transformer T1. Therefore, the PWM signal is converted by transformers T2 and T3 are is input to gates of the switches SW10 and SW12 on the primary side of the transformer T1. From this, the switches SW10 and SW12 on the primary side are isolated from the PWM signal generation circuit on the secondary side.

In order to reduce a power loss in the DC-DC converter, it is desirable to use a switching element whose on-resistance is low and whose switching speed is high. A high electron mobility transistor (HEMT) has been developed, the HEMT using gallium nitride (GaN) serving as a compound semiconductor material that is not silicon. Hereinafter, this switching transistor will be called a GaN-HEMT.

Since, compared with silicon, having high electron mobility and high mutual conductance, many compound semiconductors each have a feature that it is possible to reduce the on-resistance and capacitance generated between individual terminals of a transistor is low.

However, a silicon MOSFET of the related art is a normally-off type (enhancement type) in which turnoff is caused in a state of applying no voltage to a gate, whereas, usually the GaN-HEMT is, by contrast, a normally-on type (depression type) in which turns on in a state of applying no voltage to a gate. Therefore, in order to subject the GaN-HEMT to switching, a voltage is applied based on a negative power supply circuit.

Figure 2A:
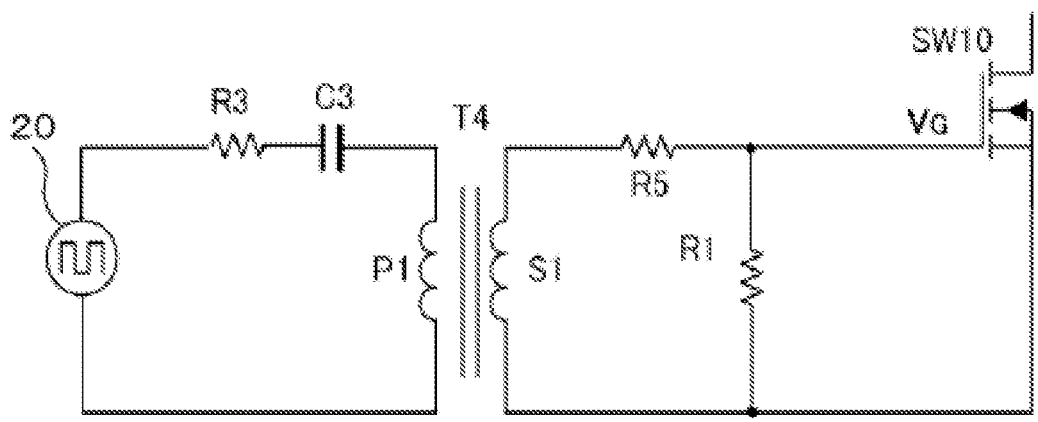
FIGS. 2A and 2B are diagrams illustrating an example of a gate drive circuit based on a transformer drive system.
Figure 2B:
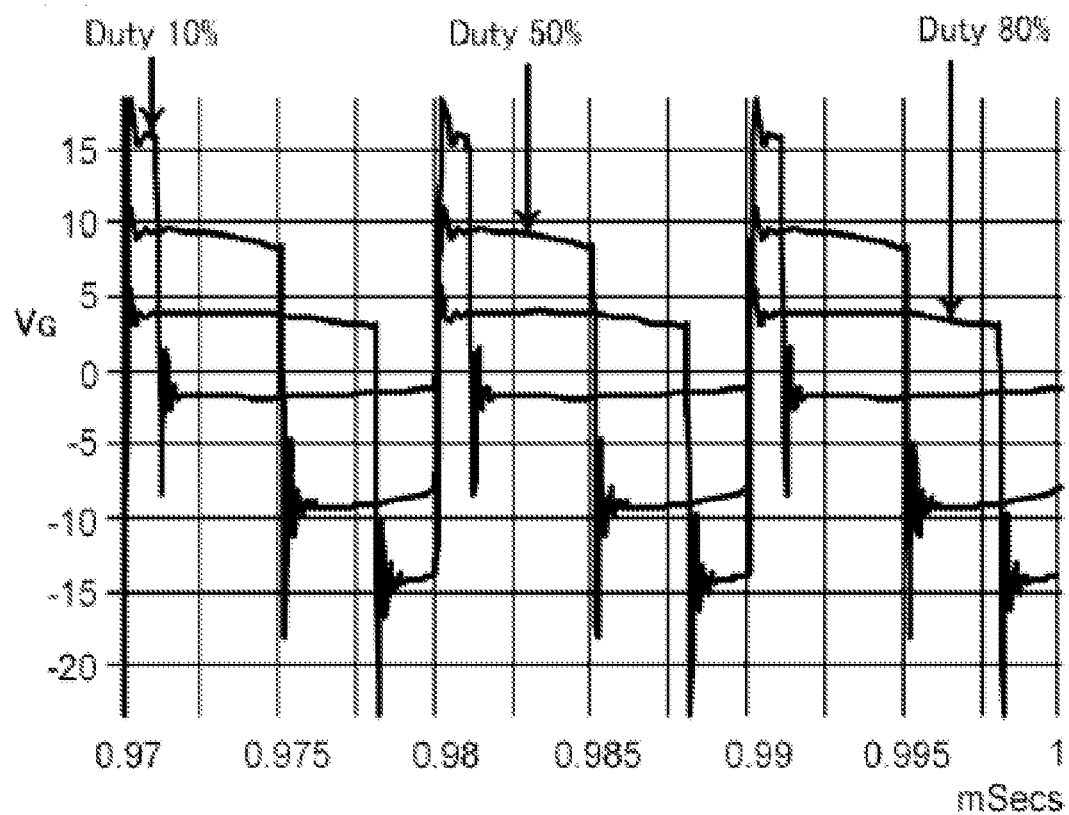

With reference to FIGS. 2A and 2B, a problem area in a case where the MOSFETs of the primary-side switches SW10 and SW12 are replaced with the GaN-HEMTs in the double-ended forward converter 10 will be described.

FIG. 2A illustrates an example of a gate drive circuit based on a transformer drive system, which controls a gate of a switching element. The gate drive circuit, based on a transformer drive system and illustrated in FIG. 2A, includes a PWM signal generation circuit 20, a damping resistor R3, a direct-current cut capacitor C3, an isolation transformer T4, and a driver circuit. The damping resistor R3 limits a current so that the direct-current cut capacitor C3 and the isolation transformer T4 do not resonate. The direct-current cut capacitor C3 cuts a direct current so that a current does not continue to flow owing to saturation of the primary side of the isolation transformer T4. The isolation transformer T4 isolates a PWM signal from the PWM signal generation circuit 20 and transmits the PWM signal to the secondary side thereof. The PWM signal transmitted to a secondary-side air is input to the gate of the switch SW10 and controls the gate of the switch SW10.

FIG. 2B illustrates waveforms of a gate voltage VG of the switching element. With reference to FIG. 2B, respective waveforms illustrate changes in the gate voltage VG of the switching element in a case where the duty ratio of the PWM signal is set to 10%, 50%, and 80%.

If the gate of the switching element SW10 is controlled by the circuit, based on a transformer drive system and illustrated in FIG. 2A, both a peak value and a zero level electric potential of the gate voltage VG fluctuate depending on the duty ratio of the PWM signal, as illustrated in FIG. 2B.

If, in this way, the gate voltage VG fluctuates depending on the duty ratio of the PWM signal, there is a possibility that it is difficult to perform a switching operation on the normally-on type GaN-HEMT.

Suitable embodiments according to the present disclosed technology will be described in detail with reference to drawings.

Figure 3:
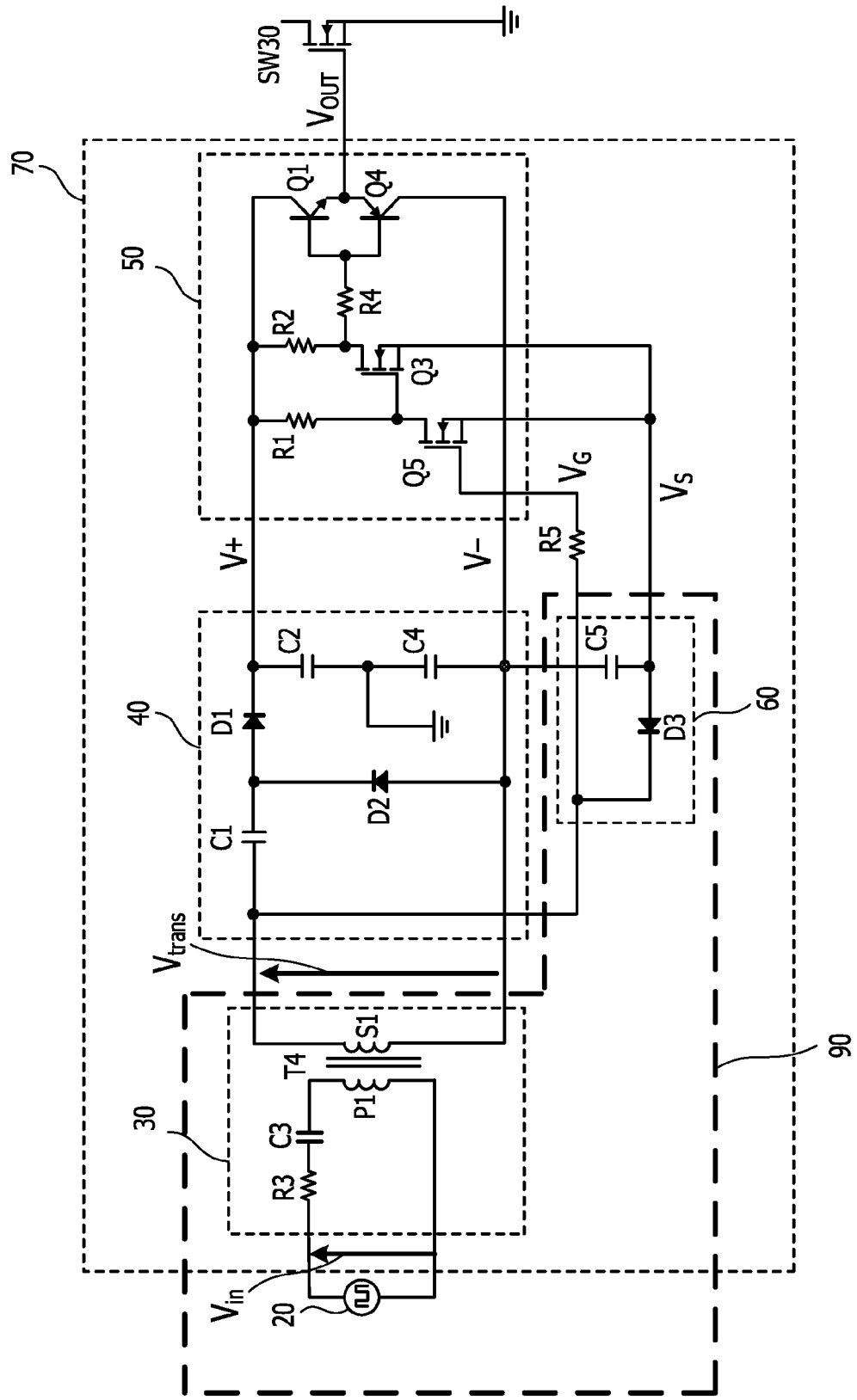
FIG. 3 is a gate drive circuit diagram of an embodiment.

FIG. 3 is a circuit diagram illustrates one embodiment of a gate drive circuit that is based on a transformer drive system and that drives a normally-on type switching element.

In FIG. 3, a same symbol is assigned to a configuration element equal to or equivalent to the gate drive circuit, based on a transformer drive system and illustrated in FIG. 2A, and the description thereof will be omitted.

A gate drive circuit 70, based on a transformer drive system and illustrated in FIG. 3, includes the PWM signal generation circuit 20, an isolated transmission circuit 30, a half-wave voltage doubler rectifier circuit 40, a driver circuit 50, and a driver minus power supply circuit 60.

The PWM signal generation circuit 20 is equivalent to a PWM signal generation circuit used in a general step-down type converter and performs switching on a normally-on type switching element SW30 by using the generated PWM signal.

The half-wave voltage doubler rectifier circuit 40 is a circuit for rectifying a secondary-side voltage Vtrans generated on the secondary side of the gate transformer T4 and generates given voltages V+ and V− independent of the duty ratio of the PWM signal. The given voltages V+ and V− are determined by the secondary-side voltage Vtrans of the gate transformer T4 and a capacity ratio between two capacitors C2 and C4 as follows.

$V+ = V\text{trans} \times C2/(C2+C4)$ $V- = -V\text{trans} \times C4/(C2+C4)$

The driver circuit 50 is a circuit for supplying the gate voltage Vout to a gate of the switching element SW30 and outputs, to the gate of the switching element SW30, one of the given voltages V+ and V− generated by the above-mentioned half-wave voltage doubler rectifier circuit 40. An NPN type transistor Q1 on the output side of the driver circuit 50 is turned on when a base voltage thereof becomes high, and the NPN type transistor Q1 supplies the given voltage V+ on a collector side thereof to the gate of the switching element SW30. By setting the given voltage V+ to a voltage that exceeds a threshold value of the normally-on type switching element SW30, the switching element SW30 is put into an on-state.

In addition, a PNP transistor Q4 is turned on when a base voltage thereof becomes low, and the PNP transistor Q4 supplies the given voltage V− on an emitter side thereof to the gate of the switching element SW30. By setting the given voltage V− to a voltage less than or equal to a threshold value of the normally-on type switching element SW30, the switching element SW30 is put into an off-state.

The base voltages of the NPN type transistor Q1 and the PNP transistor Q4 are controlled by two switching elements Q3 and Q5 configured in two stages.

The secondary-side voltage Vtrans of the gate transformer T4 is applied to a gate of the first-stage switching element Q3.

The driver minus power supply circuit 60 generates a source voltage Vs of the switching element Q3, which varies depending on the duty ratio of the secondary-side voltage Vtrans.

Figure 4A:
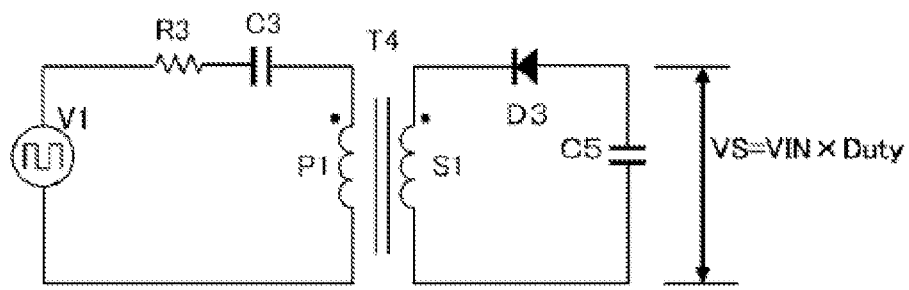
FIGS. 4A to 4D are diagrams for explaining an operation of a driver minus power supply circuit of an embodiment.
Figure 4B:
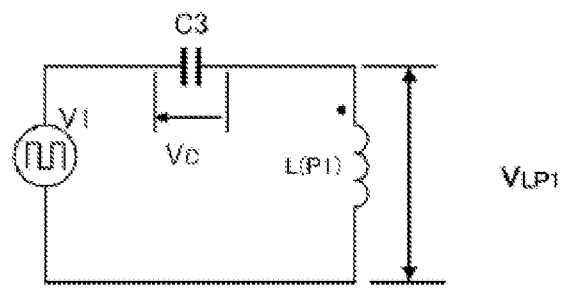

Next, using FIGS. 4A to 4D, an operation of the driver minus power supply circuit 60 will be described. FIG. 4A illustrates a circuit in which only a portion 90, which relates to generation of a driver minus power supply and surrounded by a dashed line, is extracted from the gate drive circuit 70, based on a transformer drive system and illustrated in FIG. 3.

Roles of individual components in this circuit are as follows.

R3: a damping resistor to limit a current so that the C3 and the T4 do not resonate.

C3: to cut a direct current so that a current does not continue to flow owing to saturation of the primary side of the T4.

T4: to isolate and transmit the PWM signal to the secondary side.

D3: rectifier diode.

C5: smoothing capacitor.

First, a reason why VS has a dependence property with respect to a duty ratio will be described. If being drawn by focusing on the primary side in FIG. 4A, an equivalent circuit may be illustrated by an LC equivalent circuit illustrated in FIG. 4B. This case is simplified under the assumption that since having a small value, the damping resistor R3 has little influence.

Figure 4C:
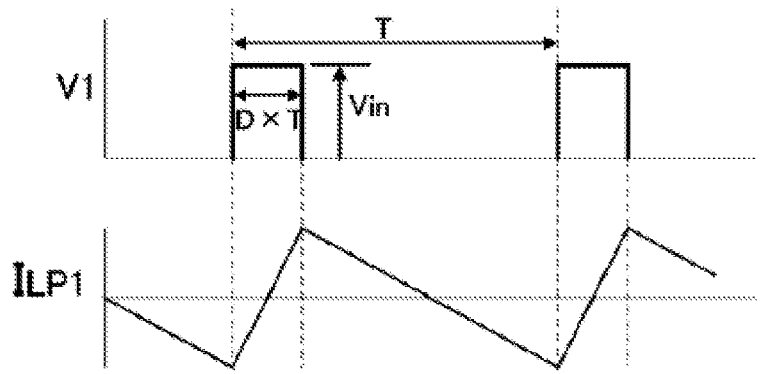

If a pulsed voltage having a peak voltage Vin is applied from a voltage source V1, a current $ILP1_1$ flowing through $LP1_1$ monotonically increases during a time period (D×T), during which a voltage is applied, and monotonically decreases in a state (D×T to T) of a zero voltage, as illustrated in FIG. 4C. So as to clarify a relationship with a duty ratio, currents in the respective time periods will be calculated.

A current change $\Delta I_{L(DT)}$ in the "D×T" time period is calculated as follows.

$$V_L = V_{in} - V_S = L_{P1}\frac{di_L}{dt}$$

$$L_{P1}\frac{di_L}{dt} = \frac{\Delta i_L}{\Delta t} = \frac{\Delta i_L}{DT} = \frac{V_{in} - V_C}{L_{P1}}$$

$$\Delta i_{L(DT)} = \frac{V_{in} - V_C}{L_{P1}}DT$$

A current change $\Delta I_{L(DT\ to\ T)}$ in the "D×T to T" time period is calculated as follows.

$$V_{LP1} = -V_C = L_{P1}\frac{di_{LP1}}{dt}$$

$$\frac{di_L}{dt} = \frac{\Delta i_{LP1}}{(1-D)T} = -\frac{V_C}{L_{P1}}$$

$$\Delta i_{L(DT \sim T)} = -\frac{V_C}{L_{P1}}(1-D)T$$

Since, in a steady state, adding $\Delta i_{L(DT)}$ to $\Delta i_{L(DT\ to\ T)}$ becomes zero, $\Delta i_{L(DT)} + \Delta i_{L(DT\ to\ T)} = 0$ In other words, $$\left(\frac{V_{in} - V_C}{L_{P1}}\right)DT - \frac{V_{in}}{L_{P1}}(1-D)T = 0$$

If collecting $V_C$, $$V_C = V_{in}D$$

If a voltage of the voltage source V1, which temporally changes, is $v_{(t)}$, a voltage $V_{LP1}$ between two end portions of $L_{P1}$ is expressed as follows.

$$V_{LP1} = v_{(t)} - V_C = v_{(t)} - V_{in}D$$

Figure 4D:
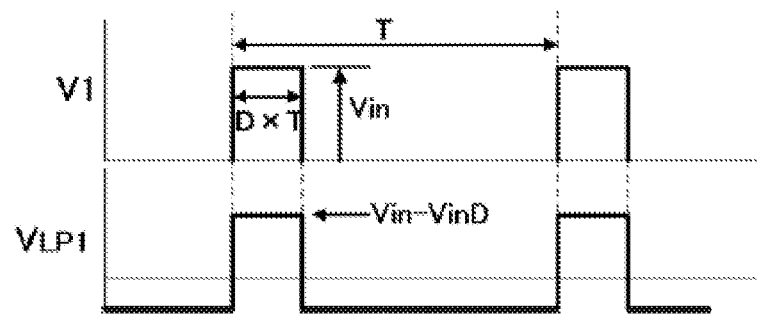

If being graphically illustrated, FIG. 4D is obtained, a peak voltage of $V_{LP1}$ is $V_{in} - V_{in}D$, and a voltage on a negative side thereof is $-V_{in}D$.

FIGS. 5A to 5G illustrate simulation waveform diagrams of the gate drive circuit, based on a transformer drive system and illustrated in FIG. 3.

If, with reference to FIG. 5A and FIG. 5B, the duty ratio of the primary-side voltage Vin of the gate transformer T4 increases, the primary-side voltage Vin being amplitude-modulated by the PWM signal, the peak value of the secondary-side voltage Vtrans decreases. In addition, depending on the duty ratio of the primary-side voltage Vin, the zero voltage electric potential of the secondary-side voltage Vtrans varies.

With reference to FIG. 5C and FIG. 5D, FIG. 5C and FIG. 5D illustrate the given voltages V+ and V−, respectively, generated by the half-wave voltage doubler rectifier circuit 40 by rectifying the secondary-side voltage Vtrans of the gate transformer T4. It may be confirmed that the given voltages V+ and V− are determined by the secondary-side voltage Vtrans of the gate transformer T4 and the capacity ratio between the two capacitors C2 and C4 and are not dependent on the duty ratio of the PWM signal.

In a case where, with reference to FIG. 5E and FIG. 5F, the duty ratio of the PWM signal is 10%, a zero level of the gate voltage VG of the first-stage switching element Q3 is −1.2 V, whereas, by contrast, the source voltage VS=−12 V×0.1=−1.2 V is satisfied. Therefore, a voltage difference between the gate and the source becomes zero. In a case where the duty ratio of the PWM signal is 50%, the zero level of the gate voltage VG of the first-stage switching element Q3 is −6 V, whereas, by contrast, contrast the source voltage VS=−12 V×0.5=−6 V is satisfied. Therefore, the voltage difference between the gate and the source becomes zero. In a case where the duty ratio of the PWM signal is 80%, the zero level of the gate voltage VG of the first-stage switching element Q3 is −9.6 V, whereas, by contrast, the source voltage VS=12 V×0.8=−9.6 V is satisfied. Therefore, the voltage difference between the gate and the source becomes zero.

In this way, even if the duty ratio of the PWM signal changes, thereby causing the zero level of the gate voltage VG of the switching element Q3 to change, it becomes possible to continuously set the voltage difference between the gate and the source to a given level by changing the source voltage VS in accordance with a change in the zero level of the gate voltage VG.

According to the present embodiment, a given voltage, generated by the half-wave voltage doubler rectifier circuit 40 and independent of the duty ratio of the PWM signal, is supplied to the gate of the normally-on GaN-HEMT on the primary side of a transformer in the double-ended forward converter. Therefore, the on-off action is correctly performed. In addition, even if the duty ratio of the PWM signal changes, it is possible to set, to a given level, a gate-to-source voltage V of the switching element Q3 in the drive circuit that controls the normally-on GaN-HEMT. Therefore, it is possible to perform a stable action.

Figure 6:
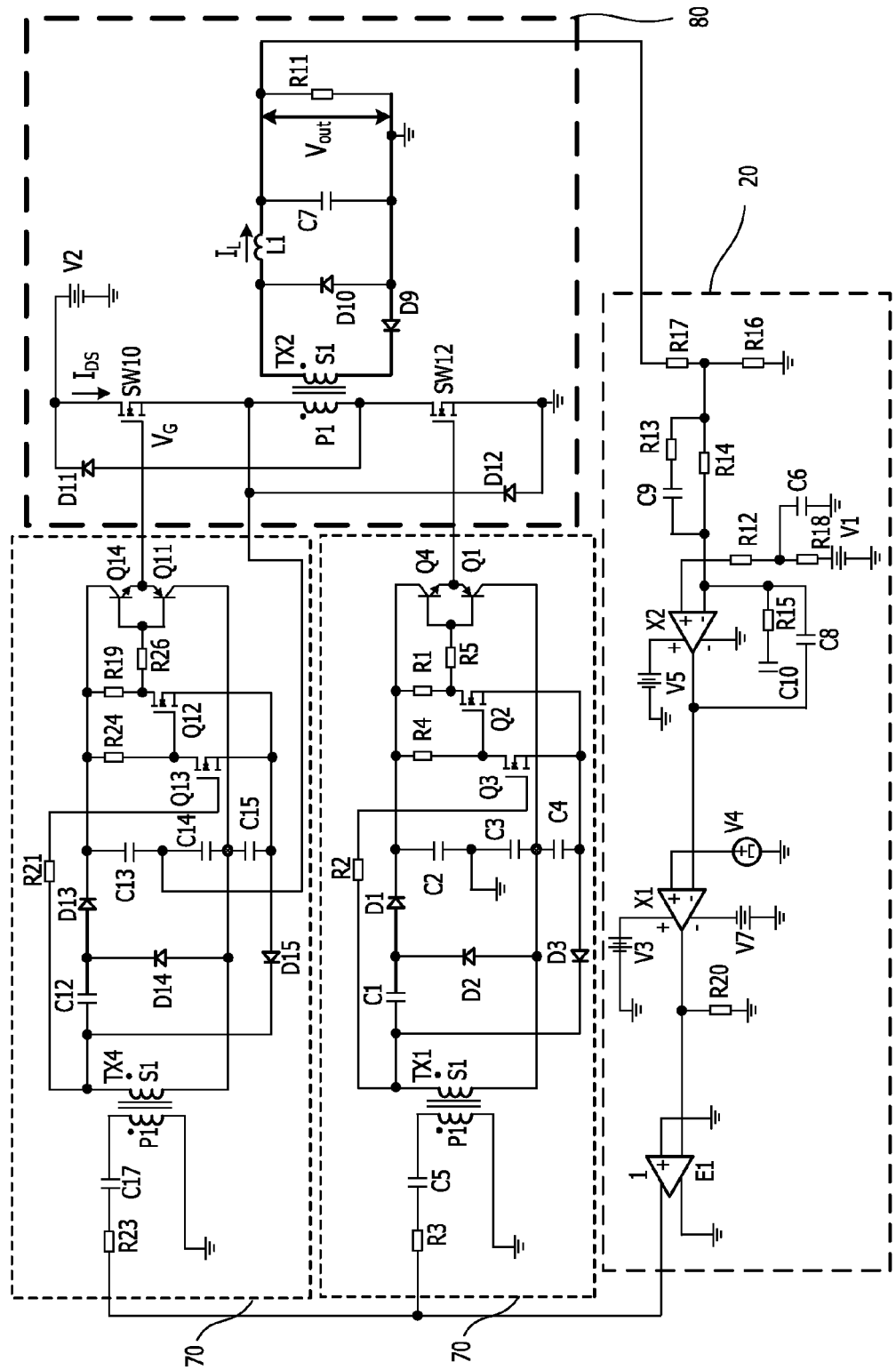
FIG. 6 is a circuit diagram in which the gate drive circuit of an embodiment is applied to a double-ended forward converter.

FIG. 6 illustrates a circuit diagram of a DC-DC converter in which each of two switches included in a double-ended forward circuit 80 is driven by the gate drive circuit 70, based on a transformer drive system and illustrated in FIG. 3.

Figure 7A:
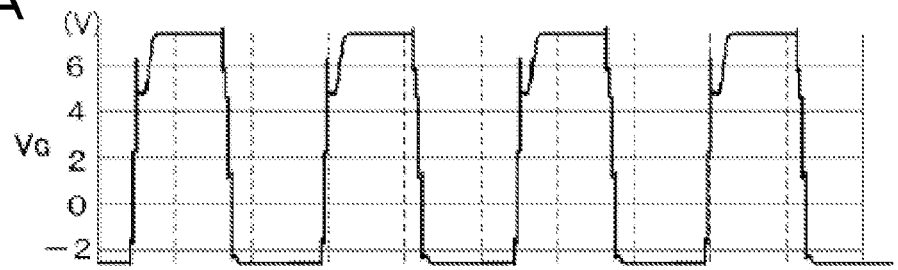
FIGS. 7A to 7D are simulation waveform diagrams of a circuit in which the gate drive circuit of an embodiment is applied to the double-ended forward converter.
Figure 7B:
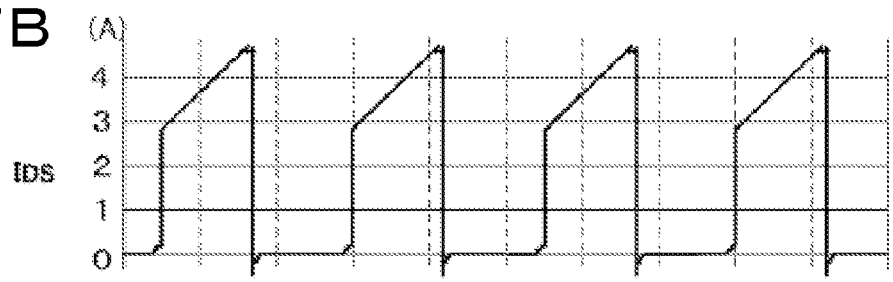
Figure 7C:
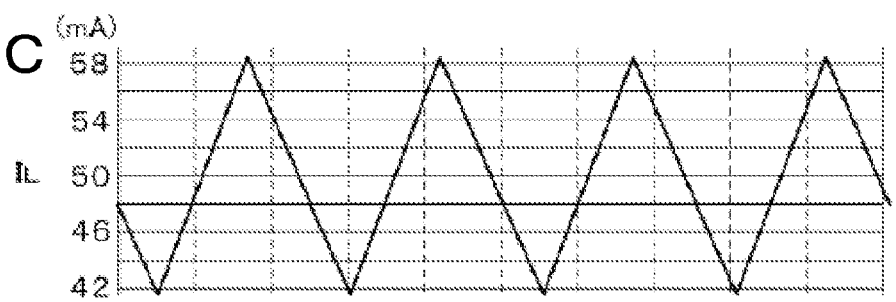
Figure 7D:
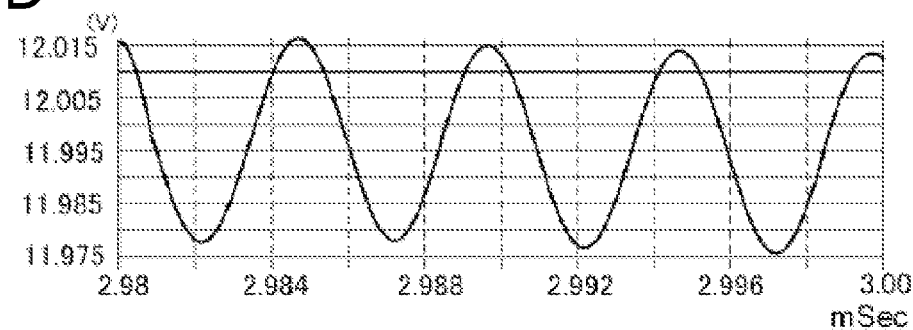

FIGS. 7A to 7D illustrate simulation waveforms of main portions of the DC-DC converter illustrated in FIG. 6. FIG. 7A illustrates a gate voltage VG of a switching element SW10, FIG. 7B illustrates a drain current IDS, FIG. 7C illustrates an inductor current IL of an inductor on an output side, and FIG. 7D illustrates a simulation waveform of a DC output voltage Vout. With reference to FIG. 7A and FIG. 7B, it is confirmed that the gate voltage VG of the normally-on GaN-HEMT falls to an electric potential of about −2 V or less at the time of being low and the flow of the drain current IDS is stopped, thereby correctly performing the on-off action.

Note that additionally the gate drive circuit, based on a transformer drive system, of an embodiment is able to be applied to a double-ended flyback type DC-DC converter.

Figure 8:
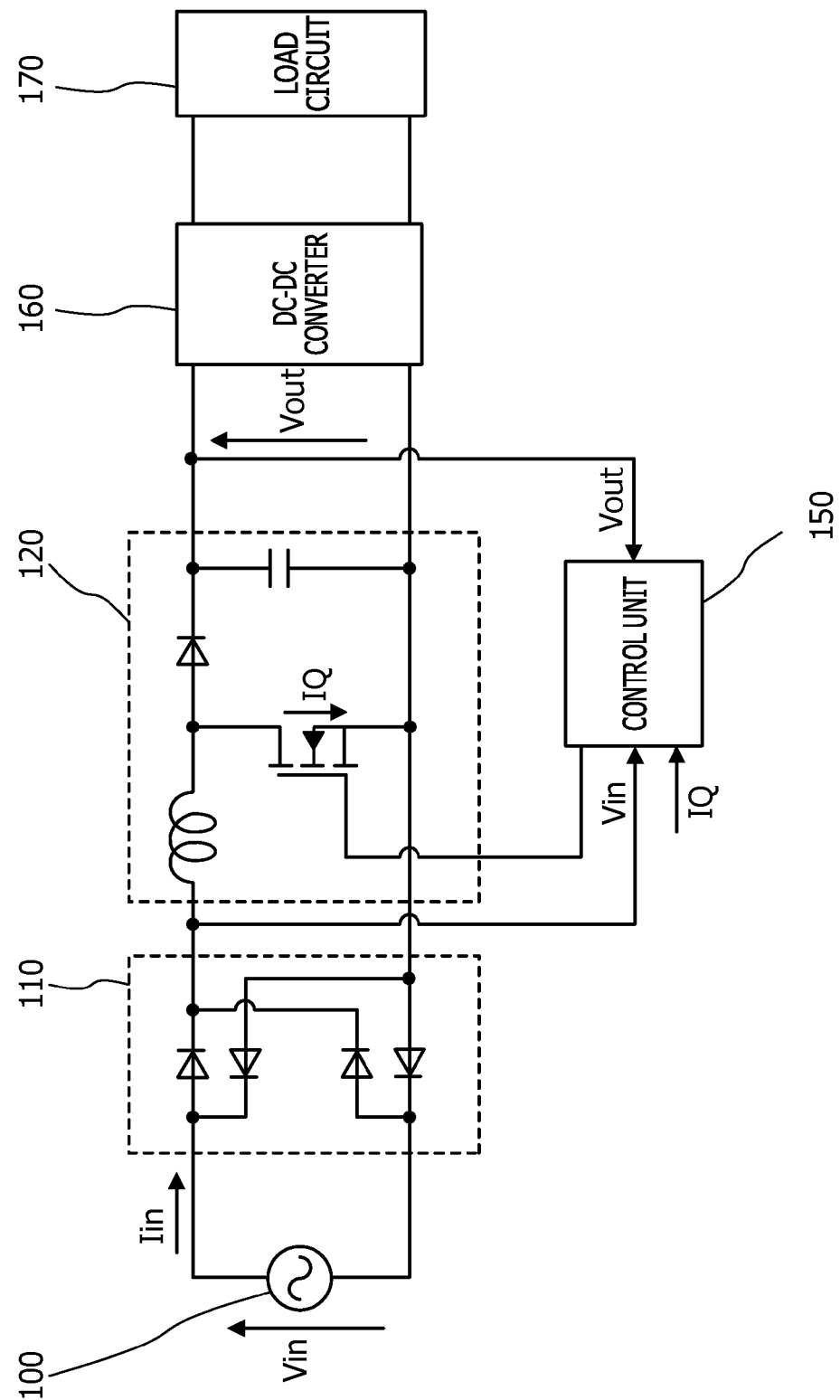
FIG. 8 is a circuit diagram of a power supply device.

FIG. 8 illustrates an example of a circuit diagram of a switching power supply device in a server or the like.

The power supply device illustrated in FIG. 8 includes a rectifier circuit 110, a PFC circuit 120, a control unit 150, and a DC-DC converter 160.

The rectifier circuit 110 is a diode bridge in which four diodes are connected in a state of bridge. The rectifier circuit 110 is connected to an alternating-current power source 100 and full-wave-rectifies and outputs alternating-current power. Here, since the output voltage of the alternating-current power source 100 is Vin, the input voltage of the rectifier circuit 110 is Vin. The rectifier circuit 110 outputs electric power obtained by full-wave-rectifying the alternating-current power input from the alternating-current power source 100.

Since the alternating-current power whose voltage is, for example, 80 (V) to 265 (V) is input to the rectifier circuit 110, voltage drops in the four diodes in the rectifier circuit 110 are negligible. Therefore, the output voltage of the rectifier circuit 110 is regarded as Vin.

The PFC circuit 120 includes an inductor, a switching element, a diode, and a smoothing capacitor, which are connected in a T shape, and is an active filter circuit that reduces a distortion such as a harmonic wave included in a current rectified by the rectifier circuit 110 and that improves a power factor of electric power.

For example, a boosting inductor is used for the inductor, and for example, a metal oxide semiconductor field-effect transistor (MOSFET) is used for the switching element. The control unit 150 applies a pulsed gate voltage to a gate of the switching element, thereby performing the on-off action of the switching element, and the switching element is pulse-width-modulation (PWM)-driven.

The diode only has to have a rectification direction oriented in a direction from the inductor to the smoothing capacitor and, for example, a fast recovery diode or a SiC schottky diode is used therefor.

The control unit 150 outputs the pulsed gate voltage to be applied to the gate of the switching element. Based on the voltage value Vin of the full-wave-rectified electric power output from the rectifier circuit 110, a current value IQ of a current flowing through a switching element 22, and a voltage value Vout on the output side of the smoothing capacitor, the control unit 150 determines the duty ratio of the gate voltage and applies the gate voltage to the gate of the switching element. As the control unit 150, a multiplier circuit capable of calculating the duty ratio, based on, for example, the current value IQ and the voltage values Vout and Vin, may be used.

The smoothing capacitor smooths a voltage output by the PFC circuit 120 and inputs the smoothed voltage to the DC-DC converter 60.

The double-ended forward type converter of the present embodiment, described above, is used for the DC-DC converter 160.

Direct-current power whose voltage is, for example, 385 (V) is input to the DC-DC converter 160, is converted by the DC-DC converter 160 into direct-current power of, for example, 12 (V), and is output to a load circuit 170.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A double-ended forward converter comprising:
a first GaN-HEMT and a second GaN-HEMT that are coupled to a primary side of a transformer;
a pulse generation circuit that generates a PWM signal;
a first isolation transformer that converts the PWM signal into a first signal for controlling the first GaN-HEMT;
a second isolation transformer that converts the PWM signal into a second signal for controlling the second GaN-HEMT;
a first half-wave voltage doubler rectifier circuit that generates first given voltages which does not depend on a duty cycle of the PWM signal;
a second half-wave voltage doubler rectifier circuit that generates second given voltages which does not depend on the duty cycle of the PWM signal;
a first driver circuit includes a first gate driver that supplies the first given voltages to a gate of the first GaN-HEMT and includes a first transistor that controls the first gate driver;
a first minus bias generation circuit that generates a first minus voltage supplied to a source of the first transistor so as to a source voltage is equal to a gate voltage of the first transistor:
a second driver circuit includes a second gate driver that supplies the second given voltages to a gate of the second GaN-HEMT; and
a second minus bias generation circuit that generates a second minus voltage supplied to a source of the second transistor so as to a source voltage is equal to a gate voltage of the second transistor.

2. A power supply device comprising:
an alternating-current power source;
a rectifier circuit that rectifies a current of the alternating-current power source;
a power factor correction circuit that smooths the rectified current and generate a first direct-current voltage; and
a DC-DC converter that generates a second direct-current voltage from the first direct-current voltage, wherein the DC-DC converter includes:
a first GaN-HEMT and a second GaN-HEMT that are coupled to a primary side of a transformer;
a pulse generation circuit that generates a PWM signal;
a first isolation transformer that converts the PWM signal into a first signal for controlling the first GaN-HEMT;
a second isolation transformer that converts the PWM signal into a second signal for controlling the second GaN-HEMT;
a first half-wave voltage doubler rectifier circuit that generates first given voltages which does not depend on a duty cycle of the PWM signal;
a second half-wave voltage doubler rectifier circuit that generates second given voltages which does not depend on the duty cycle of the PWM signal;
a first driver circuit includes a first gate driver that supplies the first given voltages to a gate of the first GaN-HEMT and includes a first transistor that controls the first gate driver;

a first minus bias generation circuit that generates a first minus voltage supplied to a source of the first transistor so as to a source voltage is equal to a gate voltage of the first transistor:
a second driver circuit includes a second gate driver that supplies the second given voltages to a gate of the second GaN-HEMT; and
a second minus bias generation circuit that generates a second minus voltage supplied to a source of the second transistor so as to a source voltage is equal to a gate voltage of the second transistor.

* * * * *